United States Patent [19]

Sallaerts et al.

[11] Patent Number: 5,479,116
[45] Date of Patent: Dec. 26, 1995

[54] LEVEL CONVERSION CIRCUITS FOR CONVERTING A DIGITAL INPUT SIGNAL VARYING BETWEEN FIRST AND SECOND VOLTAGE LEVELS TO A DIGITAL OUTPUT SIGNAL VARYING BETWEEN FIRST AND THIRD VOLTAGE LEVELS

[75] Inventors: Daniel Sallaerts, Aarschot; Leon Cloetens, Hasselt, both of Belgium

[73] Assignee: Alcatel N.V., Rijswijk, Netherlands

[21] Appl. No.: 258,525

[22] Filed: Jun. 10, 1994

[30] Foreign Application Priority Data

Jun. 15, 1993 [EP] European Pat. Off. ............. 93201711

[51] Int. Cl.$^6$ ............................................. H03K 19/0175
[52] U.S. Cl. ............................... 326/80; 326/81; 326/121
[58] Field of Search ........................ 326/80, 81, 121–122

[56] References Cited

U.S. PATENT DOCUMENTS

| | | | |
|---|---|---|---|
| 4,631,426 | 12/1986 | Nelson | 326/80 |
| 4,697,101 | 9/1987 | Iwahashi | 326/80 |
| 4,958,091 | 9/1990 | Roberts | 326/81 |
| 4,963,766 | 10/1990 | Lundberg | 326/81 |
| 5,172,016 | 12/1992 | Dobberduhl | 326/81 |
| 5,321,324 | 6/1994 | Hardee et al. | 326/80 |

FOREIGN PATENT DOCUMENTS 0388074  9/1990  European Pat. Off. .

OTHER PUBLICATIONS

"Analog MOS Integrated Circuits for Signal Processing", by R. Gregorian E.A., J. Wiley & Sons, 1986, pp. 200–203.
IBM Technical Disclosure Bulletin, "5–Volts Signal Shifter in a 3–Volts CMOS Circuit", vol. 32, No. 7, Dec. 1989, New York US, pp. 454–455.

*Primary Examiner*—Edward P. Westin
*Assistant Examiner*—Andrew Sanders
*Attorney, Agent, or Firm*—Frishauf, Holtz, Goodman, Langer & Chick

[57] ABSTRACT

A level converts circuit converting a digital input signal varying between a first (VSS) and a second (VDD1) voltage level to a digital output signal varying between the first (VSS) and a third voltage. (VDD2) the local conversion circuit includes between first (VDD2) and second (VSS) poles of a DC supply source a series connection of a load impedance (P2/P3/N3) and the main paths of a first transistor (N2) and of a second transistor (N1), to a control electrode of which the input signal is applied. The first and second transistor are of a same first conductivity type. A third transistor (P1) of a second conductivity type is connected in parallel with the second transistor (N1). A control electrode of the third (P1) and first (N2) transistors are biased by a constant DC bias voltage (VBIAS1A/VBIAS1B), and a junction point of the load impedance (P2/P3/N3) and the series connection being an output terminal (OUT) of the level conversion circuit.

8 Claims, 1 Drawing Sheet

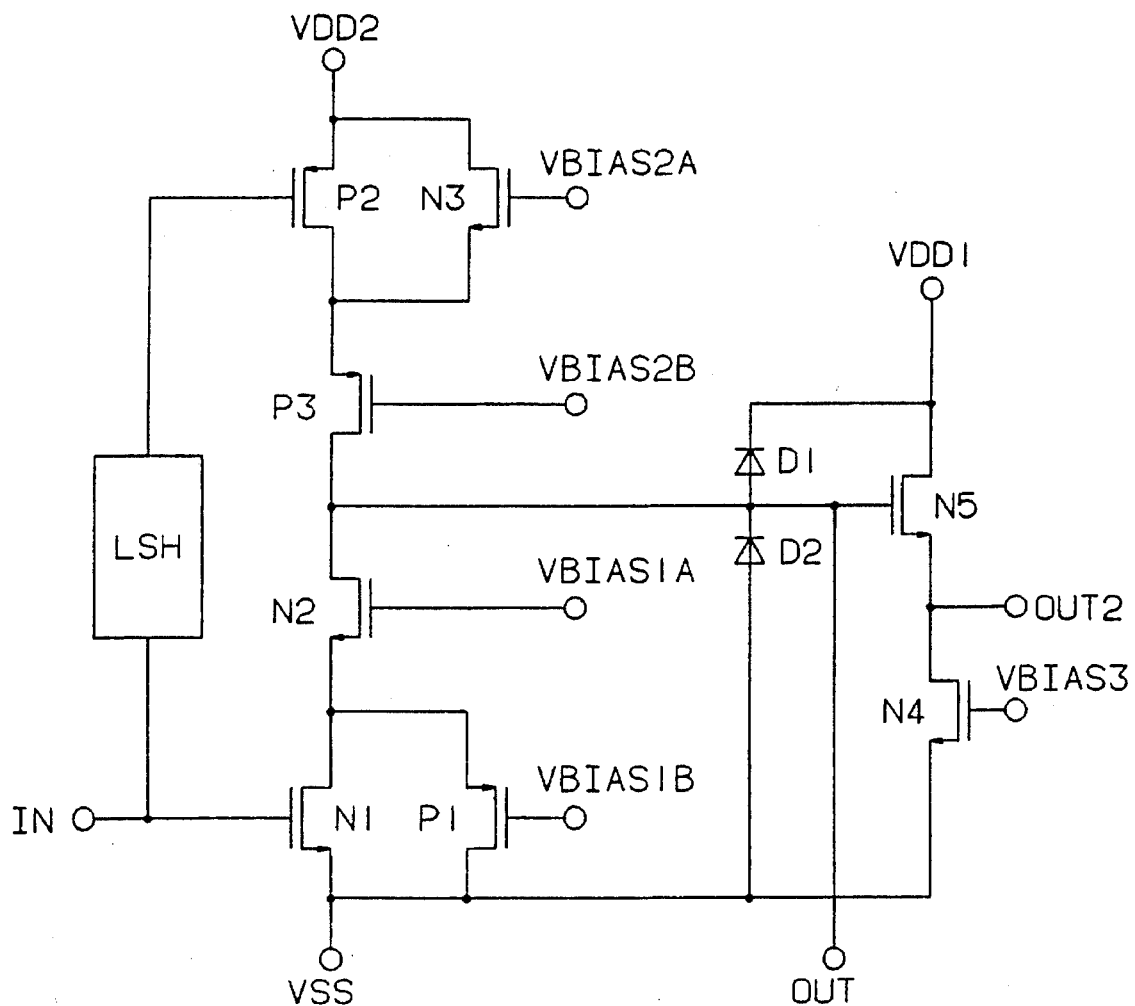

LEVEL CONVERSION CIRCUITS FOR CONVERTING A DIGITAL INPUT SIGNAL VARYING BETWEEN FIRST AND SECOND VOLTAGE LEVELS TO A DIGITAL OUTPUT SIGNAL VARYING BETWEEN FIRST AND THIRD VOLTAGE LEVELS

BACKGROUND OF THE INVENTION

1. Field of the Invention

The present invention relates to a level conversion circuit for converting a digital input signal varying between first and second voltage levels to a digital output signal varying between said first level and a third voltage level, and including between first and second poles of a DC supply source the series connection of the main paths of a first transistor and of a second transistor, to the control electrode of which said input signal is applied.

2. Description of the Prior Art

Such a level conversion circuit is already known in the art, e.g. from the published European patent application EEP 0 388 074 A1. Therein, the first and second transistors are of opposite conductivity type and two further third and fourth transistors are coupled between the two DC supply poles in a similar way as the first and second transistors and in parallel to the series connection of the latter transistors. The first and third transistors are of PMOS conductivity type, and the second and fourth transistors are of NMOS conductivity type. The complement of the input signal is applied to the gate electrode of the third transistor. The junction point between the third and fourth transistors constitutes a true output terminal of the level conversion circuit, and the junction point between the first and the second transistor constitutes a complemented output terminal. The gate electrode of the second transistor is connected to the true output terminal, whereas the gate electrode of the fourth transistor is connected to the complemented output terminal. The voltage provided at the first DC supply pole is 0 volts and the voltage provided at the second DC supply pole is 5 volts.

Such a level conversion circuit is for instance used to convert a digital input signal varying between 0 volts and 3.3 volts to a digital output signal varying between 0 volts and 5 volts, the digital input signal being provided by circuitry operating with a 3.3 volt supply voltage as is necessary when the conductor line widths are so small and the gate oxide layers are so thin that the use of e.g. a 5 volts supply voltage would cause problems of metal electromigration and hot electron effects, respectively. The latter digital signal is then applied to circuitry operating with a 5 volt supply voltage. To be noted that the problem of metal electromigration is due to the current through the conductor, i.e. smaller conductor line widths necessitate lower currents and thus lower supply voltages.

When the input signal is high, i.e. 3.3 volts, the first transistor is turned on and the third transistor is turned off. As a result, the voltage at the complemented output is low and the fourth transistor is turned on, thereby causing the voltage at the true output terminal to be high and the second transistor to be turned off. Across the main paths as well as across the gate drain junctions of both the second transistor and the third transistor a voltage drop of 5 volt is produced. Across the gate drain junction of the fourth transistor also a voltage drop of 5 volt is produced. For an input signal which is low similar conclusions apply.

Thus, it is clear that together with the input signal a complemented version thereof is needed in the above level conversion circuit. Furthermore, when the level conversion circuit is integrated on a chip operating with a 3.3 volt power supply necessary because of small line widths and thin gate oxide layers thereon, then problems due to metal electromigration and hot electron effects may occur since voltage drops across the transistors may rise up to 5 volts instead of the maximum allowed 3.3 volts, which is the maximum of the input voltage.

SUMMARY OF THE INVENTION

An object of the present invention is to provide a level conversion circuit of the above known type but wherein no complement of the input signal is needed and wherein voltage drops across the transistors of the circuit are in absolute value limited to the maximum of the input voltage.

According to the invention, this object is achieved due to the fact that said level conversion circuit further includes a load impedance between said first DC supply pole and an output terminal connected to said series connection, wherein said second transistor, which is of a same first conductivity type as said first transistor, is connected in parallel to a main path of a third transistor of a second conductivity type opposite to said first conductivity type, and whose control electrode and that of said first transistor are biased by a constant DC bias voltage, the junction point of said load impedance and said series connection constituting an output terminal of the conversion circuit.

In this way, because of the DC bias voltage applied to the control electrode of the first transistor, this transistor isolates the second transistor from the second DC supply pole so that the voltage across any two poles of this first transistor is prevented from rising above the maximum input voltage. Indeed, when the input signal is equal to the first voltage level, then the second transistor is turned off and the voltage across its main path rises until a limit voltage which causes the first transistor to be also turned off. The latter limit voltage depends upon the DC bias voltage applied to the control electrode of the second transistor. Furthermore, in order to avoid that due to a slow charging of parasitic capacitances present at the junction point between the first and the second transistor the voltage thereat would rise too much above the mentioned limit voltage, the third transistor is provided which when the voltage at the latter junction point becomes too high is turned on thereby reducing the latter voltage until the third transistor is turned off again. Thus, the voltage at the junction point between the first and the second transistor is limited to a voltage between a minimum value below which the second transistor is turned on and a maximum value above which the third transistor is turned on. The latter values can be so chosen that the voltage across any junction of the first, second or third transistor is at most equal to the maximum input signal level. Furthermore, it is clear that no complement of the input signal is needed.

Another characteristic feature of the present invention is that said level conversion circuit includes a level clamping circuit.

In this way, a protection against too high and too low a voltage on the output terminal is provided.

The above mentioned and other objects and features of the invention will become more apparent and the invention itself will be best understood by referring to the following description of an embodiment taken in conjunction with the accompanying drawing which shows a level conversion circuit according to the invention.

BRIEF DESCRIPTION OF THE DRAWINGS

FIG. 1 is a level conversion circuit.

DETAILED DESCRIPTION

This level conversion circuit is used to convert a first digital signal varying between 0 volt and 3.3 volt applied to an input terminal IN to a second digital signal varying between 0 volt and 5 volt provided at an input/output or output terminal OUT, and to convert a third digital signal varying between 0 volt and 5 volt applied to the input/output terminal OUT to a fourth digital signal varying between 0 volt and 3.3 volt provided at an output terminal OUT2. The first and fourth digital signals are for instance used in circuitry operating with a 3.3 volt supply voltage, whereas the second and third digital signals are used in circuitry operating with a 5 volt supply voltage. Such level conversion circuits become necessary when small line widths and very thin gate oxides raise problems of metal electromigration and hot electron effects, thereby ruling out the possibility of a 5 volt supply voltage and necessitating the use of a lower supply voltage, e.g. 3.3 volt, when, moreover, such 3.3 volt circuits are to be used together with circuits operating with a 5 volt supply voltage, and when one wants to implement the circuit on a 3.3 volt integrated circuit, i.e. where no gate or junction voltage may rise above 3.3 volt in order to avoid the above mentioned problems. It is evident that other supply voltage combinations than the above 3.3 volt/5 volt are possible.

The level conversion circuit shown in the drawing includes between a positive pole VDD2 of a DC supply source providing a like named positive supply voltage and a negative pole VSS thereof providing a like named negative supply voltage the series connection of source drain paths of a PMOS transistor P2 and of a PMOS transistor P3 and drain source paths of an NMOS transistor N1 and of an NMOS transistor N2. The source drain path of a PMOS transistor P1 is coupled in parallel to the drain source path of N1, and the drain source path of an NMOS transistor N3 is coupled in parallel to the source drain path of P2. The gate of N2 is biased by a DC bias voltage VBIAS1A and that of P1 by a DC bias voltage VBIAS1B, whereas the gate of N3 is biased by a DC bias voltage VBIAS2A and that of P3 by a DC bias voltage VBIAS2B. The input terminal IN is coupled to the gate of N1 and via a level shift circuit LSH to the gate of P2. Such a level shift circuit merely duplicates the digital signal applied to IN at a higher level and is e.g. described in the book 'Analog MOS integrated circuits for signal processing' by R. Gregorian e.a., J. Wiley & Sons, 1986, pp. 200 to 203. In order to be able to turn off transistor P2 completely, the output signal of LSH must have a high level equal to VDD2. The interconnected drains of N2 and P3 constitute the input/output terminal OUT which is connected to a clamping circuit which is constituted by a diode or diode means D2 whose anode is connected to VSS and whose cathode is connected to OUT, and a diode or diode means D1 whose cathode is connected to a positive pole VDD1 of the DC supply source providing a like named positive supply voltage and whose anode is connected to OUT. The level conversion circuit further includes between VDD1 and VSS the series connection of drain source paths of two NMOS transistors N5 and N4. The gate of N5 is connected to the input/output terminal OUT, and the gate of N4 is connected to a DC bias voltage VBIAS3. The connecting terminal between N4 and N5 constitutes the output terminal OUT2.

To be noted that the part P2, P3, N3 of the circuit can be seen as a load impedance for the part N1, N2, P1 of the circuit, and that it may also be replaced by a load impedance proper. Such a configuration is referred to in literature as an open drain configuration. In that case, LSH is no longer needed. Furthermore, when the input signal is high a DC current will then flow from positive supply pole VDD2 via transistors N2 and N1 to VSS thus giving additional power dissipation, whereas no such DC current flows in the circuit shown in the drawing, as will become clear hereinafter.

The values of the supply and bias voltages are given in the following table.

| | |
|---|---|
| VSS | 0 volt |
| VDD1 | 3.3 volt |
| VDD2 | 5 volt |
| VBIAS1A | 3 volt |
| VBIAS1B | 2 volt |
| VBIAS2A | 3 volt |
| VBIAS2B | 2 volt |
| VBIAS3 | see text |

Also, since the input signal of the level shift circuit LSH varies between 0 volt and 3.3 volt and since its output must be a digital signal with a high level of 5 volt (VDD2), the latter output digital signal varies between 1.7 volt corresponding to a 0 volt input level and 5 volt corresponding to a 3.3 volt input level.

The operation of the level conversion circuit is now described hereinafter. First the conversion of a digital signal varying between 0 and 3.3 volt to one varying between 0 and 5 volt as performed by the upper part of the circuit is considered.

When the voltage at IN is high, i.e. 3.3 volt, then N1 is turned on and the voltage at its drain is pulled down. When the latter voltage is at the so-called threshold voltage VTN2 of N2 below VBIAS1A then N2 is turned on. At the same time a 5 volt signal is applied to the gate of P2 via LSH, so that P2 is turned off and the voltage at its drain drops until it is at the absolute value of the threshold voltage |VTP3| of P3 above VBIAS2B at which point P3 is also turned off. Here, |.| denotes the absolute value. N3 makes sure that the voltage at the drain of P2 can not drift to too low a voltage. Indeed, when this voltage is at the threshold voltage VTN3 of N3 below VBIAS2A, N3 is turned on and the voltage increases to VBIAS2A minus VTN3 again. Thus, the voltage at the drain of P2 is confined between VBIAS2A−VTN3 and VBIAS2B+|VTP3|. Since N1 and N2 are turned on and P2 and P3 are turned off, the voltage at OUT drops to about VSS, i.e. 0 volt. To be noted that VBIAS2A−VTN3 must be lower than VBIAS2B+|VTP3| in order to avoid a voltage which is lower than VBIAS2A−VTN3 but higher than VBIAS2B+|VTP3| to be able to turn on both N3 and P3.

When the voltage at IN is low, i.e. 0 volt, then N1 is turned off and the voltage at its drain rises until it reaches the threshold voltage VTN2 of N2 below VBIAS1A at which point N2 is also turned off. P1 makes sure that the voltage at the drain of N1 can not drift to too high a voltage. Indeed, when this voltage is at the absolute value of the threshold voltage |VTP1| of P1 above VBIAS1B, P1 is turned on and the voltage is pulled down to VBIAS1B plus |VTP1| again. Thus, the voltage at the drain of N1 is confined between VBIAS1A−VTN2 and VBIAS1B+|VTP1|. At the same time a 1.7 volt signal is applied to the gate of P2 via LSH, whereby P2 is turned on so that the voltage at its drain rises. When this voltage is at |VTP3| above VBIAS2B, P3 is turned on. Since N1 and N2 are turned off and P2 and P3 are turned on, the voltage at OUT rises to about VDD2, i.e. 5 volt. To be noted that VBIAS1A−VTN2 must be lower than VBIAS1B+|VTP1| in order to avoid a voltage which is lower than VBIAS1A−VTN2 but higher than VBIAS1B+|VTP1| to be able to turn on both N2 and P1.

Now the conversion of a digital signal varying between 0 and 5 volt to one varying between 0 and 3.3 volt as performed by the lower part of the circuit is considered.

When the voltage at the input/output terminal OUT is high, i.e. 5 volt, then transistor N5 is turned on and the voltage at terminal OUT2 increases to VDD1, i.e. 3.3 volt. On the other hand, when the voltage at OUT is low, i.e. 0 volt, then N5 is turned of and the voltage at OUT2 drops to nearly 0 volt. N4 operates as a current sink and the voltage VBIAS3 at its gate determines the maximum current flowing through N4. To be noted that VBIAS3 must at least be equal to the threshold voltage VTN4 of N4. A typical value for VBIAS3 corresponding to the above voltages is about 2.5 volt.

The voltages across the different transistor junctions of the circuit for the different cases are given in the following tables.

The first table concerns the case where the input voltage is low.

TABLE I

VIN = 0 volt
VOUT = 5 volt
VOUT2 = 3.3 volt

| VGS | | VGD | | VDS | |
|---|---|---|---|---|---|
| N1 | 0 volt | N1 | see text | N1 | see text |
| N2 | see text | N2 | −2 volt | N2 | see text |
| N3 | −2 volt | N3 | −2 volt | N3 | 0 volt |
| P1 | see text | P1 | 2 volt | P1 | see text |
| P2 | −3.3 volt | P2 | −3.3 volt | P2 | 0 volt |
| P3 | −3 volt | P3 | −3 volt | P3 | 0 volt |
| N4 | VBIAS3 | N4 | VBIAS3 − 3.3 volt | N4 | 3.3 volt |
| N5 | 1.7 volt | N5 | 1.7 volt | N5 | volt |

The second table concerns the case where the input voltage is high.

TABLE II

VIN = 3.3 volt
VOUT = 0 volt
VOUT2 = 0 volt

| VGS | | VGD | | VDS | |
|---|---|---|---|---|---|
| N1 | 3.3 volt | N1 | 3.3 volt | N1 | 0 volt |
| N2 | 3 volt | N2 | 3 volt | N2 | 0 volt |
| N3 | see text | N3 | −2 volt | N3 | see text |
| P1 | 2 volt | P1 | 2 volt | P1 | 0 volt |
| P2 | 0 volt | P2 | see text | P2 | see text |
| P3 | see text | P3 | 2 volt | P3 | see text |
| N4 | VBIAS3 | N4 | VBIAS3 | N4 | 0 volt |
| N5 | 0 volt | N5 | −3.3 volt | N5 | 3.3 volt |

Herein, VIN denotes the voltage at the input terminal IN, VOUT the voltage at OUT, VOUT2 the voltage at OUT2, VGS the respective gate source voltages, VGD the respective gate drain voltages and VDS the respective drain source voltages.

From these two tables I and II above it follows that, provided some precautions are taken, the voltage across any junction never exceeds 3.3 volt, thus making it possible to implement the level conversion circuit on an integrated circuit which because of small line widths and thin gate oxides operates with a 3.3 volt supply voltage. Therefor, VBIAS3 must be lower than 3.3 volt which poses no problems as a typical NMOS transistor has a threshold voltage of 0.7 volt which however because of the so-called bulk effect due to the voltage between substrate and source of the transistor, when different from zero, may change. A typical value is then e.g. 1.7 volt which is well below 3.3 volt and hence, VBIAS3 can be chosen between this 1.7 volt and 3.3 volt depending on the maximum current to be conducted by N4.

Two further important parameters are VTP1 and VTN2 which when the input is low determine the voltage at the drain of N1 and thereby also the VDS of N1, N2 and P1, the VGD of N1, and the VGS of N2 and P1. As shown above, this voltage at the drain of N1 lies between VBIAS1A−VTN2 and VBIAS1B+|VTP1|. Hence, VDS of N1<VBIAS1B−VSS+|VTP1|;

|VDS| of P1<BVIAS1B−VSS+|VTP1|;

VDS of N2<VDD2−VBIAS1A+VTN2;

|VGD| of N1<VDD2−VBIAS1B−VSS+|VTP1|;

VBIAS1A−VBIAS1B−|VTP1|<VGS of N2<VTN2;

−|VTP1|<VGS of P1<VBIAS1B−VBIAS1A+VTN2.

From these inequalities it follows that one can limit the junction voltages in the circuit to a maximum of 3.3 volt by making VBIAS1B−VSS+|VTP1|, VDD2−VBIAS1A+VTN2, |VTP1| and VTN2, and VBIAS1A−VBIAS1B−|VTP1| and VBIAS1B−VBIAS1A+VTN2 less than 3.3 volt. Thus, with the above voltages it then follows that both |VTP1| and VTN2 must be less than 1.3 volt.

Likewise, when the input is high VTP3 and VTN3 determine the voltage at the drain of P2 and thereby also the VDS of P2, P3 and N3, the VGD of P2, and the VGS of P3 and N3. As shown above, this voltage at the drain of P2 lies between VBIAS2A−VTN3 and VBIAS2B+|VTP3|. Hence,

|VDS| of P2<VDD2−VBIAS2A+VTN3;

|VDS| of p3<VBIAS2B−VSS+|VTP3|;

VDS of N3−VDD2−VBIAS2A+VTN3;

VGD of P2<VDD2−VBIAS2A+VTN3;

−|VTP3|<VGS of P3<VBIAS2B−VBIAS2A+VTN3;

VBIAS2A−VBIAS2B−|VTP3|<VGS of N3<VTN3.

From these inequalities it follows that one can limit the junction voltages in the circuit to a maximum of 3.3 volt by making VDD2−VBIAS2A+VTN3, VBIAS2B−VSS+|VTP3|, |VTP3| and VTN3, and VBIAS2B−VBIAS2A+VTN3 and VBIAS2A−VBIAS2B−|VTP3| less than 3.3 volt. Thus, with the above voltages it then follows that both |VTP3| and VTN3 must be less than 1.3 volt.

It should be noted that, as mentioned above, a typical value of the threshold voltage when no bulk effect is present is 0.7 volt, which is however changed when the voltage between the source and the substrate is different from zero. The design should take this bulk effect into account in order that the threshold voltage of P1, N2, P3 and N3 are restricted to the above limits. When a so-called n-well process is used for implementing the circuit, then the bulk effect can be avoided for transistors P1 and P3 by connecting the n-well with the respective sources, so that the threshold voltages of P1 and P3 remain about 0.7 volt.

To be noted further that VBIAS1A and VBIAS1B, as well as VBIAS2A and VBIAS2B, may be constituted by a same bias voltage, e.g. 2.5 volt, which only changes the above quantitatively, although the principles remain the same.

The diodes D1 and D2 prevent excessive voltages on the input/output terminal OUT from damaging the level conversion circuit. Indeed, when the voltage at OUT becomes too high, D1 is made conductive whereby the voltage at OUT is limited to VDD1+0.7 volt. When a number of series connected diodes is used, e.g. n, the voltage at OUT is limited to VDD1+n×0.7 volt. Thus, with the above voltages D1 has to be constituted by a series connection of three diodes so that the voltage at OUT is limited to 5.4 volt. The cathode of D1 may also be connected to VDD2 in which case the voltage at OUT is limited to VDD2+n×0.7 volt. On the other hand, when the voltage at OUT becomes too low D2 is made conductive whereby the voltage at OUT is also limited to VSS−0.7 volt or to VSS−n×0.7 volt when n series connected diodes are used. With the above voltages one diode is used for D2 thus limiting the voltage at OUT to above −0.7 volt.

While the principles of the invention have been described above in connection with specific apparatus, it is to be clearly understood that this description is made only by way of example and not as a limitation on the scope of the invention.

We claim:

1. A level conversion circuit for converting a digital input signal varying between a first (VSS) voltage level and a second (VDD1) voltage level to a digital output signal varying between said first voltage level (VSS) and a third voltage level (VDD2), said level conversion circuit comprising:

a series circuit coupled between first (VDD2) and second (VSS) poles of a DC supply source, said series circuit including a series connection of main paths of a first transistor (N2) and of a second transistor (N1), a control electrode of the second transistor (N1) being connected to receive said digital input signal:

a load impedance (P2, P3, N3) coupled between said first DC supply source pole (VDD2) and an output terminal (OUT) of said level conversion circuit, said load impedance being connected to said series connection of main paths of the first and second transistors (N2, N1);

wherein said second transistor (N1) is of a same first conductivity type as said first transistor (N2);

a third transistor (P1) having a main path which is connected in parallel to said second transistor (N1), said third transistor (P1) being of a second conductivity type opposite to said first conductivity type, and said third transistor (P1) having a control electrode; and a control electrode of said first transistor (N2) and said control electrode of said third transistor (P1) being biased by respective constant DC bias voltages (VBIAS1A, VBIAS1B).

2. A level conversion circuit according to claim 1, wherein said first (VDD2) and second (VSS) DC supply source poles are at said third (VDD2) and first (VSS) voltage levels, respectively.

3. A level conversion circuit according to claim 1, wherein said second voltage level (VDD1) is lower than said third voltage level (VDD2).

4. A level conversion circuit according to claim 1, further comprising a level clamping circuit coupled between said DC supply source and said output terminal (OUT).

5. A level conversion circuit according to claim 4, wherein said level clamping circuit comprises:

a first diode (D1) having a cathode coupled to a third DC supply pole (VDD1) of said DC supply source, and having an anode thereof coupled to said output terminal (OUT); and a second diode (D2) having an anode thereof coupled to said first pole of said DC supply source (VSS) and having a cathode thereof coupled to said output terminal (OUT).

6. A level conversion circuit according to claim 1, wherein:

said load impedance (P2, P3, N3) includes:

a second series circuit coupled between said first DC supply source pole (VSS) and said output terminal (OUT), the second series circuit including a series connection of main paths of fourth (P2) and fifth transistors (P3), both said fourth and fifth transistors being of said second conductivity type, and a sixth transistor (N3) of said first conductivity type having a main path which is connected in parallel to said main path of said fourth transistor (P2);

respective second DC bias voltages (VBIAS2A, VBIAS2B) applied to control electrodes of said fifth (P3) and sixth (N3) transistors; and wherein:

said digital input signal is also applied to a control electrode of said fourth transistor (P2).

7. A level conversion circuit according to claim 6, wherein said digital input signal is applied to said control electrode of said fourth transistor (P2) via a level shift circuit (LSH).

8. A level conversion circuit according to claim 1, wherein a third DC supply pole (VDD1) is connected to supply a voltage equal to said second voltage level (VDD1) between said second DC supply source pole (VSS) and the output terminal (OUT) and further comprising:

a third series circuit including a series connection of main paths of seventh (N4) and eighth (N5) transistors;

said eighth transistor (N5) having a control electrode which is connected to said output terminal (OUT);

said seventh transistor (N4) having a control electrode which is biased by a third DC bias voltage (VBIAS3); and a coupling terminal positioned between said seventh (N4) and eighth (N5) transistors, said coupling terminal comprising a second output terminal (OUT2), whereby said level conversion circuit is operable as an input/output buffer.

* * * * *